United States Patent [19]

Hill et al.

[11] Patent Number: 5,534,312
[45] Date of Patent: Jul. 9, 1996

[54] METHOD FOR DIRECTLY DEPOSITING METAL CONTAINING PATTERNED FILMS

[75] Inventors: Ross H. Hill, Coquitlam, Canada; Bentley J. Palmer, Athens, Ga.; Alfred A. Avey, Jr., Burnaby, Canada; Sharon L. Blair, Vancouver, Canada; Chu-Hui W. Chu; Meihua Gao, both of Burnaby, Canada; Wai L. Law, Port Moody, Canada

[73] Assignee: Simon Fraser University, Burnaby, Canada

[21] Appl. No.: 339,127

[22] Filed: Nov. 14, 1994

[51] Int. Cl.[6] ........................................ H05H 1/00
[52] U.S. Cl. .................. 427/533; 427/270; 427/272; 427/282; 427/377; 427/380; 427/383.1; 427/404; 427/419.3; 427/552; 427/558; 427/581; 427/597
[58] Field of Search ........................ 427/533, 552, 427/558, 581, 597, 270, 272, 282, 377, 380, 383.1, 404, 419.3

[56] References Cited

U.S. PATENT DOCUMENTS

| 4,952,556 | 8/1990 | Mantese et al. | 505/1 |
| 5,064,685 | 11/1991 | Kestenbaum et al. | 427/53.1 |
| 5,277,980 | 1/1994 | Mino | 428/403 |

FOREIGN PATENT DOCUMENTS

| 62-263973 | 11/1987 | Japan. |
| 1004738 | 1/1989 | Japan. |
| 6002145 | 1/1994 | Japan. |

OTHER PUBLICATIONS

S. L. Blair et al., *Solid–state photochemistry of platinum (II) methylazide complexes as thin films on Si (111) surfaces: photolithography of platinum films*, Journal of Materials Science 29 (1994) 2143–2146 (no month available).

B. J. Palmer et al., *Photolithography of amorphous films of $(\eta^5-C_5H_5)_2$ $Ti(N_3)_2$ on silicon (111) resulting in $TiO_2$: the mechanism of the photodeposition reaction*, Journal of Materials Science 28 (1993) 6013–6020 (no month available).

Douglas G. Bickley et al., *Solid state photochemistry of $(C_8H_{12})Pt(N_3)_2$ as thin films on Si(111) surfaces*, J. Photochem. Photobiol. A: Chem., 67 (1992) 181–186 (no month available).

Teresa W. H. Ho et al., *Solid state photochemistry of $(C_2H_4(Ph_2P)_2)M(N_3)_2$ (M=Ni, Pd, Pt) on Si(111) surfaces*, J. Photochem. Photobiol. A: Chem., 69 (1992) 229–235 (no month available).

Sharon L. Blair et al., *The photochemical production of nickel films from thin films of the inorganic nickel complexes trans–$NiN_4X_2$ ($N_2=Et_2NC_2H_4NH_2$, $MeHNC_2$ $H_4NMeH$; $X=NO_2$, $NO_3$, $NCS$)*, J. Photochem. Photobiol. A: Chem., 81 (1994) 183–191 (no month available).

Primary Examiner—Bernard Pianalto
Attorney, Agent, or Firm—Oyen Wiggs Green & Mutala

[57] ABSTRACT

A photoresist-free method for making patterned films of metal oxides, metals, or other metal containing compounds is described. The method involves applying an amorphous film of a metal complex to a substrate. The film may be conveniently applied by spin coating using standard industry techniques. The metal complex used is photoreactive and undergoes a low temperature chemical reaction in the presence of light of a suitable wavelength. The end product of the reactions depends upon the atmosphere in which the reactions take place. Metal oxide films may be made in air. Patterned films may be made by exposing only selected portions of the film to light. Patterns of two or more materials may be laid down from the same film by exposing different parts of the film to light in different atmospheres. The resulting patterned film is generally planar. Separate planarization steps are not generally required.

32 Claims, 5 Drawing Sheets

METHOD FOR DIRECTLY DEPOSITING METAL CONTAINING PATTERNED FILMS

FIELD OF THE INVENTION

This invention relates to methods for fabricating patterned films of metals or metal containing compounds on a substrate. The invention has particular application in forming patterned films comprising metal oxides and/or metals. Other applications include the interconnection of components on semi-custom chips and the patterning of integrated circuits, either instead of or in conjunction with photo-resist based patterning. The methods of the invention may be used in the manufacture of certain VLSI devices.

BACKGROUND OF THE INVENTION

U.S. Pat. No. 4,952,556, Mantese et al. discloses a method for making patterned films of superconductor materials. The method involves depositing films of a metallo organic material on a substrate and patterning the film with an electron beam, ion beam or laser. The patterning is accomplished by local heating or energy deposit in the film and does not involve a photochemical reaction.

Various electronic devices can be made by depositing thin patterned films of materials having different electrical characteristics on a substrate. Current techniques for manufacturing such devices generally begin with a suitable substrate, such as a wafer of crystalline silicon, on which materials having various electrical characteristics are deposited. These current techniques are expensive because they generally include many steps. Typically, each step involves applying a photo-resist to the surface of the substrate; changing the properties of selected areas of the photoresist by exposing those areas to light, X-rays or an electron beam; removing either the exposed or unexposed portions of the photoresist to expose portions of the underlying substrate; chemically treating or depositing a material on the exposed portions of the substrate; and removing the photo-resist. A disadvantage of many such prior art techniques is that resolution can be lost in what is essentially a two-stage masking process.

Some prior art processes include depositing a layer of material on a substrate, applying a photoresist to areas where it is desirable to retain the material, and then etching the material away in places where it is not required. This method has the disadvantages set out above and the further disadvantage that the edges of the retained material can be rough or undercut. This can ultimately lead to cracks which can cause the device to fail.

Another disadvantage of these processes is that they tend to produce a non-planar surface. In these methods materials are often not uniformly deposited over the surface of the substrate. If a generally planar surface is required then a separate planarization step is required.

In many instances it is necessary to apply a metal film to a semiconductor material to make or connect to an electronic device. Prior art techniques apply such films by evaporation. Evaporation heats the material to which the film is being applied. The high temperature produced at the interface between the evaporated metal and the underlying material causes metal atoms to diffuse into the material and vice-versa. This results in a layer of mixed metal and semiconductor at the metal-semiconductor interface which can interfere with the performance of the device.

Japanese patent application No. 1004738, assigned to Fujitsu Ltd., discloses a method for making a patterned film on a substrate. The method involves depositing a metallic resinate, together with a photo-crosslinking agent, on a substrate. The photo-crosslinking agent is then exposed and developed to yield a pattern which can be reduced to a pattern of metallic wires by sintering. This method does not disclose a photochemical reaction which causes a metal complex to convert into a metal containing material, such as metal oxide, on a substrate. It requires a high temperature sintering step which is not necessary in processes according to the present invention.

Japanese patent application No. 62263973, Omura, discloses a method for making a patterned thin metal film. The method uses an electron beam to decompose portions of an organometallic thin film to form metals. This method does not involve a photochemical reaction.

Kestenbaum et al., U.S. Pat. No. 5,064,685, discloses a method for making patterns of metals. The method involves applying a metal-organic ink to a substrate. The metal organic ink is then heated with a laser to pyrolize the ink to leave a deposited metal film. This method exposes the substrate to high temperatures and does not allow for the deposition of materials other than metals.

Bickley, et al. *Solid state photochemistry of $(C_8H_{12})Pt(N_3)_2$ as thin films on Si(111) surfaces* J. Photochem. Photobiol. A: Chem., 67 (1992) 181–186 and Ho et al. *Solid state photochemistry of $(C_2H_4(Ph_2P)_2)M(N_3)_2$ (M=Ni, Pd, Pt) on Si(111) surfaces* J. Photochem. Photobiol. A: Chem., 69 (1992) 229–235 disclose that certain metal complexes deposited on a Silicon substrate can be caused to undergo photochemical reactions which result in the loss of the ligands associated with the metal complex. The films of metal which were produced were very impure. These references do not disclose or suggest direct patterning of amorphous films of metal complexes. They suggest that such metal complexes might be useful in photochemical vapour deposition.

Some researchers have experimented with photolithography of metal containing polymer films to produce patterns of metals. These methods generally involve patterning a photosensitive polymer film, washing away some parts of the film with a solvent and then reducing the remaining parts of the film to a metal film by pyrolysis. It is hard to produce pure metal films by these techniques.

SUMMARY OF THE INVENTION

This invention provides a method for making a pattern of a metal containing material on a substrate. The method includes the steps of depositing an amorphous film of a metal complex on a surface of a substrate; placing the film in a selected atmosphere; and exposing selected areas of the film to electromagnetic radiation, which is preferably ultra-violet light, to cause the metal complex in the selected areas to undergo a photo-chemical reaction. The reaction transforms the metal complex in the selected areas into a new metal containing material adherent to the substrate.

In one embodiment of the invention the selected atmosphere comprises oxygen and the new metal containing material is a metal oxide. In another embodiment of the invention, a metal oxide produced according to the invention is reacted with a suitable chemical in a suitable atmosphere to reduce the metal oxide to a metal adherent to the substrate.

In a preferred method according to the invention a local temperature of the new material is maintained below an annealing temperature of the new material.

Another aspect of the invention provides for the deposition of two different materials in a pattern. This aspect of the invention involves the steps of depositing an amorphous film of a metal complex on a surface of a substrate; placing the film in a first selected atmosphere; and exposing first selected areas of the film to electromagnetic radiation, which is preferably ultraviolet light, to cause the metal complex in the first selected areas to undergo a photo-chemical reaction. The reaction transforms the metal complex in the first selected areas into a first new metal containing material adherent to the substrate. Subsequently, the film is placed in a second selected atmosphere; and second selected areas of the film are exposed to electromagnetic radiation to cause the metal complex in the second selected areas to undergo a photo-chemical reaction. The reaction transforms the metal complex in the second selected areas into volatile components and a second metal containing material adherent to the substrate. The method can be used to make self-planar structures.

In a preferred embodiment, the steps of exposing the first and second selected areas of the film to electromagnetic radiation respectively comprise aligning first and second masks over the substrate and illuminating surfaces of the masks away from the substrate with electromagnetic radiation, which is preferably ultraviolet light.

The metal complex comprises one or more metal atoms bonded to one or more ligands. In one aspect of the invention at least one ligand comprises an azide group. Preferably the ligands are selected from the group consisting of: acetylacetonates (both substituted and unsubstituted); dialkyldithiocarbamates; carboxylate; pyridines; amines; diamines; arsines; diarsenes; phosphines; diphosphenes; arenes; alkoxy ligands; alkyl ligands; and aryl ligands. For depositing metals, metal oxides and metal sulfides, the ligands are preferably small and do not comprise any organic groups containing more than 26 carbon atoms. Most preferably, if the ligands do not include phenyl groups then the ligands do not comprise any organic groups containing more than 12 carbon atoms.

BRIEF DESCRIPTION OF THE DRAWINGS

In drawings which illustrate specific embodiments of the invention, but which should not be construed as restricting the spirit or scope of the invention in any way.

DETAILED DESCRIPTION OF THE PREFERRED EMBODIMENT

Figure 1:
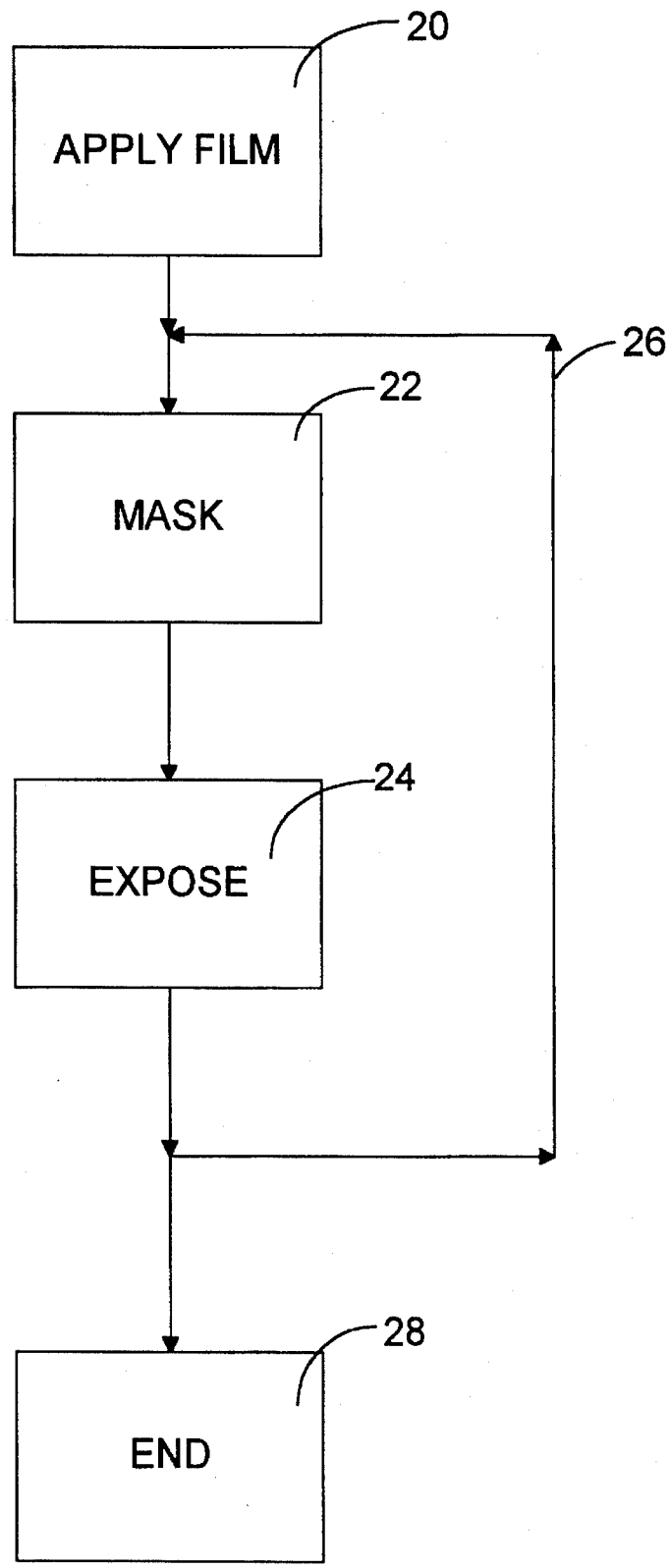
FIG. 1 is a block diagram outlining the steps in practising an exemplary method according to the invention.

This invention provides a process for making a structure comprising a film on a substrate. The film is patterned and has areas comprising different materials. Unlike most prior art processes, the process does not require the steps of applying and removing a photo-resist or similar material to the structure being fabricated.

The process of the invention involves applying an amorphous film 40 of a metal complex 41 to a substrate 44 and then selectively converting portions of film 40 to different metal containing materials by photo-chemically reacting selected portions of film 40 in a selected atmosphere. The metal complexes which may be used to practise the invention are discussed below.

The material of substrate 44 may be any one of a wide variety of materials which are-compatible for the purposes of the invention with film 40 and the metal complex 41. Substrate 44 should be a material which does not impair the photochemical reactions described below, is capable of adhering to film 40. If the device being manufactured will be exposed to large thermal variations then substrate 44 should have a coefficient of expansion reasonably well matched to that of the material to be deposited. However, because this invention does not require high temperature process steps, it is not as important for the coefficient of expansion of the substrate to be matched to that of the material being deposited as it is in prior art methods. Substrate 44 may be, for example, a clean silicon wafer or chip which may be etched or may have an oxide coating, or a quartz slide.

FIGS. 1 and 2A, 2B, 2C, 2D and 2E, illustrate the use of the process of the invention to create a patterned film. The process begins (step 20) by applying an amorphous film 40 of a selected photo-reactive metal complex 41 to a substrate 44. Film 40 may generally be conveniently applied to substrate 44 by spin-coating and typically has a thickness of between 20 nm and several µm. The thickness depends upon the desired end product. Where the goal is to deposit a very thin layer of a material, such as titanium, for use as a binding agent then film 40 should be very thin, for example, in the range of 20–50 nm. Where the goal is to deposit a conductor approximately 0.5 µm thick then film 40 is most preferably in the range of approximately 2–5 µm thick. Where the goal is to produce a layer of a dielectric material then film 40 preferably has a thickness between these ranges. In any case, it is best that film 40 be as thin as possible to achieve the desired goal. It is easier for reaction by-products to diffuse out of thin films 40 and it is easier to completely expose thin films 40 to light.

The spin coating is carried out by placing a drop of a solution of metal complex 41 in a chemically compatible solvent onto substrate 44 and then rotating substrate 44. In the alternative, a drop of metal complex 41 in solution may be dropped on a spinning substrate. The spin coating of metal complex 41 on a substrate 44 may generally be accomplished with the same equipment used to apply films of photoresist in prior art processes. For example, a commercial spin coating machine, of a type available from Headway Research Inc. of 3713 Forest Lane, Garland Tex. may be used. The thickness of film 40 may be adjusted, as is known in the spin coating art, by adjusting the rate of spin of the substrate, the viscosity of the solution, and the concentration of the solution. In some cases, the rate of feed of the solution is also a factor. The spin coating may be carried out at room temperature. For example, where metal complex 41 is $Ni(CO)_2(PPh_3)_2$ (wherein Ph represents a phenyl group) the solvent used may be methylene chloride. With a solution having a concentration of $1.57 \times 10^{-2}M$ and a spin speed of 725 R.P.M. a film having a thickness of approximately 90 nm (90 monolayers) is formed. After the spin coating is complete, the resulting film 40 is allowed to dry.

Next, in step 22, a first mask 48 is aligned over film 40 and film 40 is placed in a first atmosphere 50. First mask 48 has both opaque areas and transparent areas 58. The transparent areas 58 correspond to areas 60 in which it is desired to convert film 40 into a different material.

In step 24, the side of mask 48 away from film 40 is exposed to light from a light source 54. Light source 54 emits light of a wavelength (typically in the blue or ultraviolet wavelengths) which is absorbed by metal complex 41. In general, shorter wavelengths are preferred because short wavelengths offer higher pattern resolution. The resolution of the process is generally limited by diffraction of the light from light source 54 around mask 48.

For the examples discussed herein, light source 54 may be a Xe lamp or a Hg vapour lamp, such as a 100 W high pressure Hg vapour lamp in an Oriel™ housing equipped with condenser lenses and a 10 cm water filter with quartz optics. A HeCd laser emitting light at 325 nm and/or 416 nm has useful properties for use as a light source in association with many metal complexes 41.

Light from light source 54 passes through transparent areas 58 in first mask 48 and illuminates areas 60 of film 40. Other areas 61 of film 40 are in the shadow of first mask 48 and are not illuminated.

Metal complex 41 in illuminated areas 60 of film 40 reacts under the action of the light in first atmosphere 50 in a low temperature photochemical reaction to form a first new material 70 which is adherent to substrate 44. For example, the first atmosphere may be air and first new material 70 may be a metal oxide. In non-illuminated areas 61, metal complex 41 does not react with first atmosphere 50 because the light necessary for the chemical reaction is not present.

The time required to complete the photochemical reaction varies with the thickness of the film and the intensity of the applied light. The speed varies from metal complex to metal complex. Typical exposure times vary between 2 minutes in light from a 50 W Hg vapour lamp and several hours under light from a 100 W Hg vapour lamp. Light from light source 54 should be as intense as possible to speed the reaction without interfering with the reaction itself. The light used should not be so intense as to unduly heat the substrate. In general, the temperature of the substrate should be maintained at a temperature lower than the annealing temperature of new material 70. The temperature should also be maintained lower than the temperature at which metal complex 41 thermally decomposes. In most cases the temperature of the substrate should not exceed 320° C. or some lower temperature. It is a feature of the invention that, if necessary, many useful new materials 70 may be deposited at room temperature, which is impossible with most practical prior art processes.

Figure 2A:
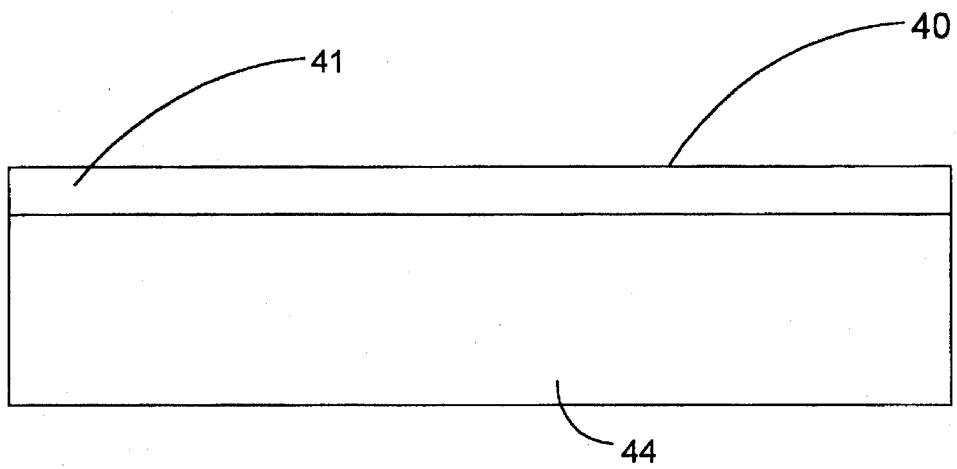
FIGS. 2A, 2B, 2C, 2D and 2E are schematic diagrams illustrating intermediate steps in the creation of a patterned film on a substrate according to the method of FIG. 1.
Figure 2B:
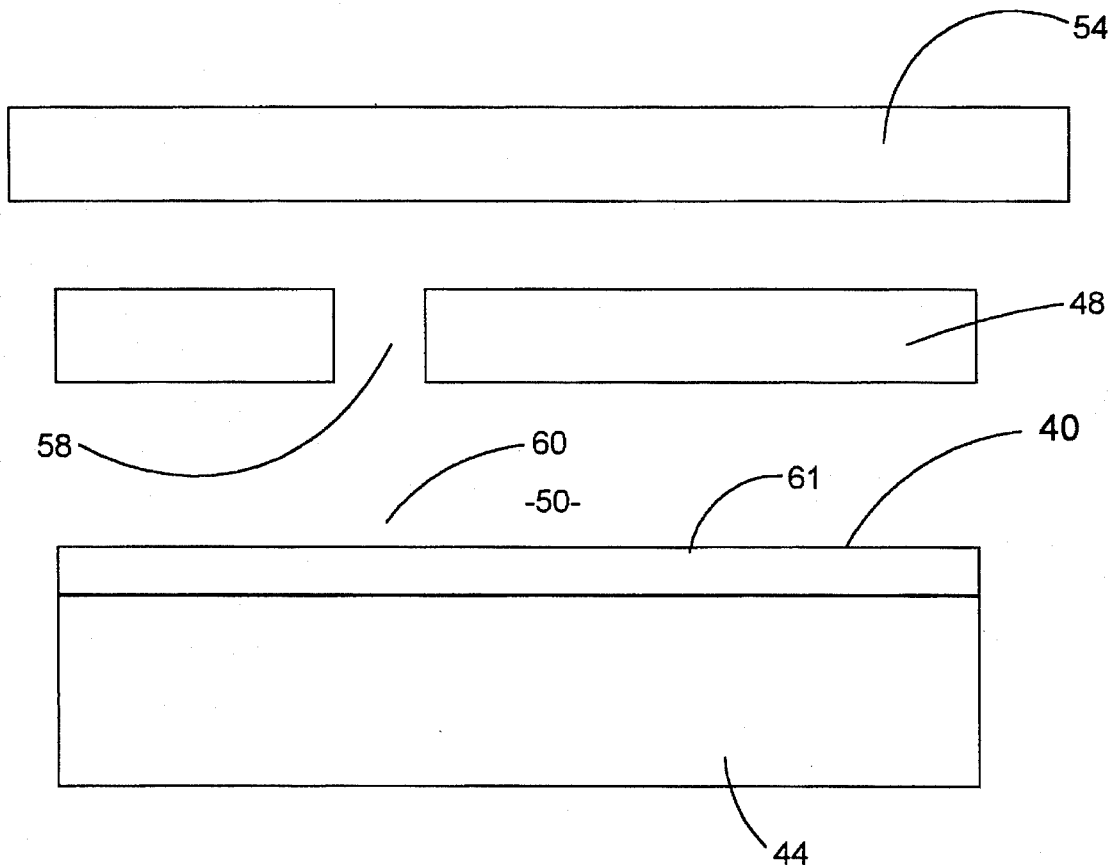
Figure 2C:
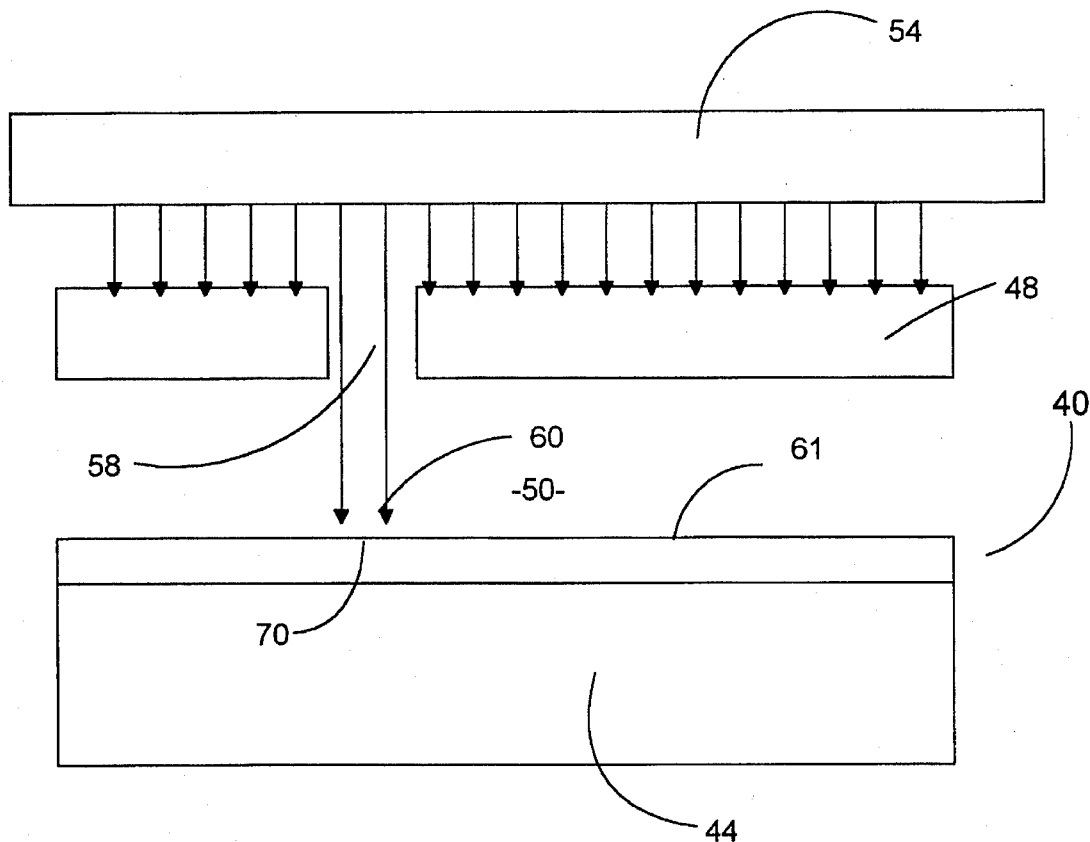
Figure 2D:
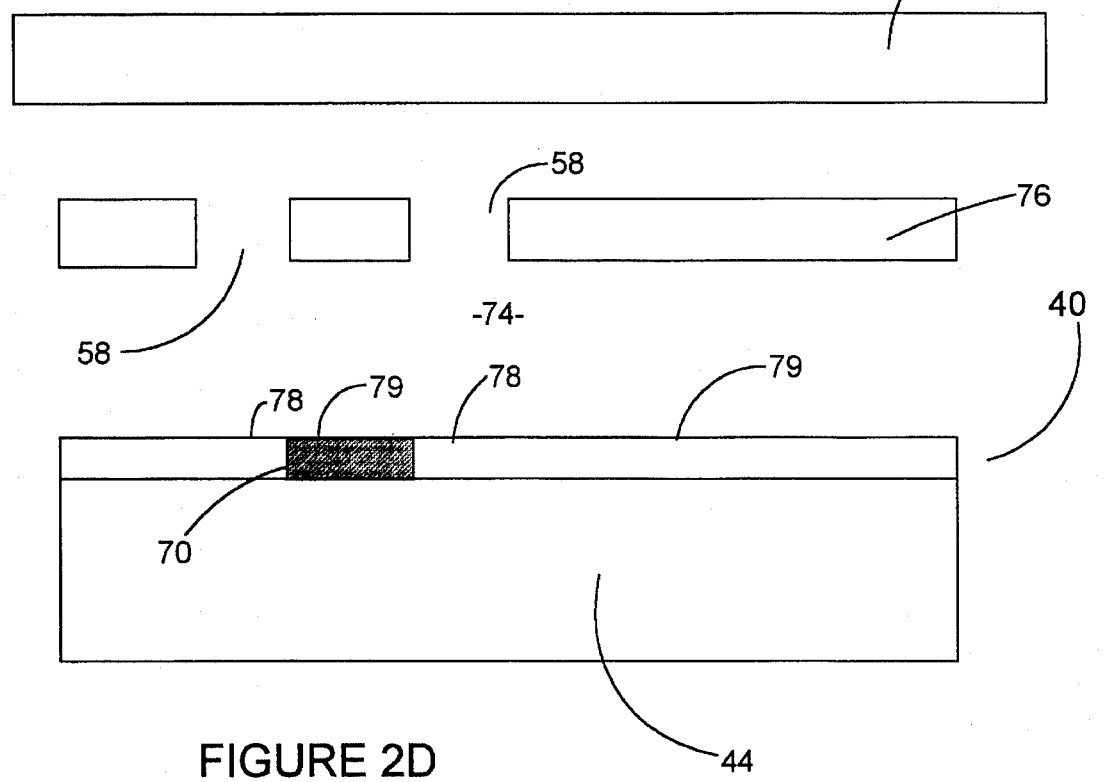
Figure 2E:
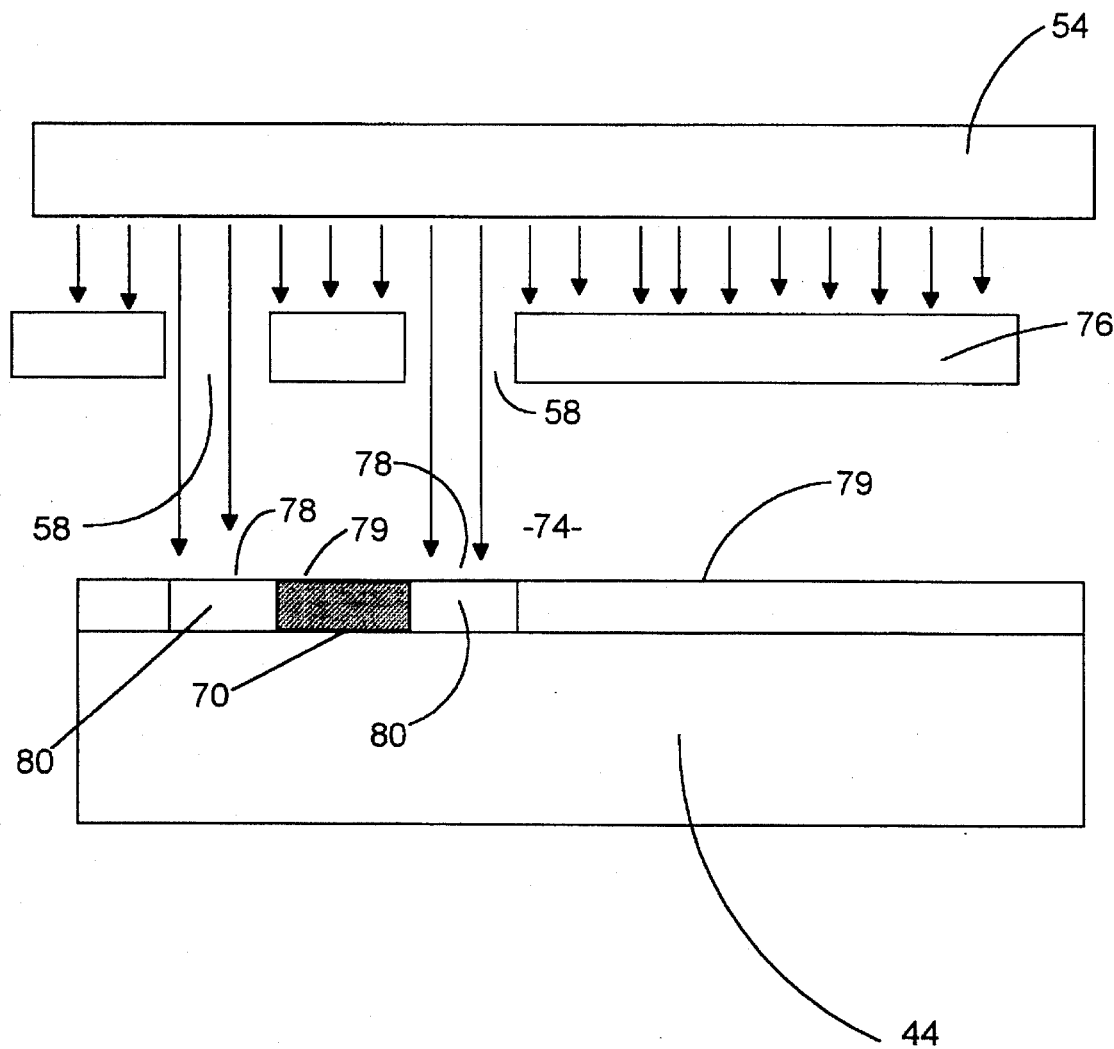

As indicated by arrow 26, steps 22 and 24 may be repeated, with different masks in different atmospheres, to form areas of other materials in film 40. For example, as shown in FIGS. 2D and 2E, film 40 is placed in a second atmosphere 74 and a second mask 76 is aligned over film 40. Second mask 76 is then exposed to light from light source 54. The light passes through transparent areas 58 in second mask 76 and illuminates areas 78 of film 40. In illuminated areas 78 of film 40 metal complex 41 reacts under the action of the light, in the second atmosphere 74 to form a second new material 80. Portions of film 40 in non-illuminated areas 79 of film 40 are unaffected. The result, as shown in FIG. 2E is a planar structure comprising regions of first new material 70 and second new material 80.

Figure 3:
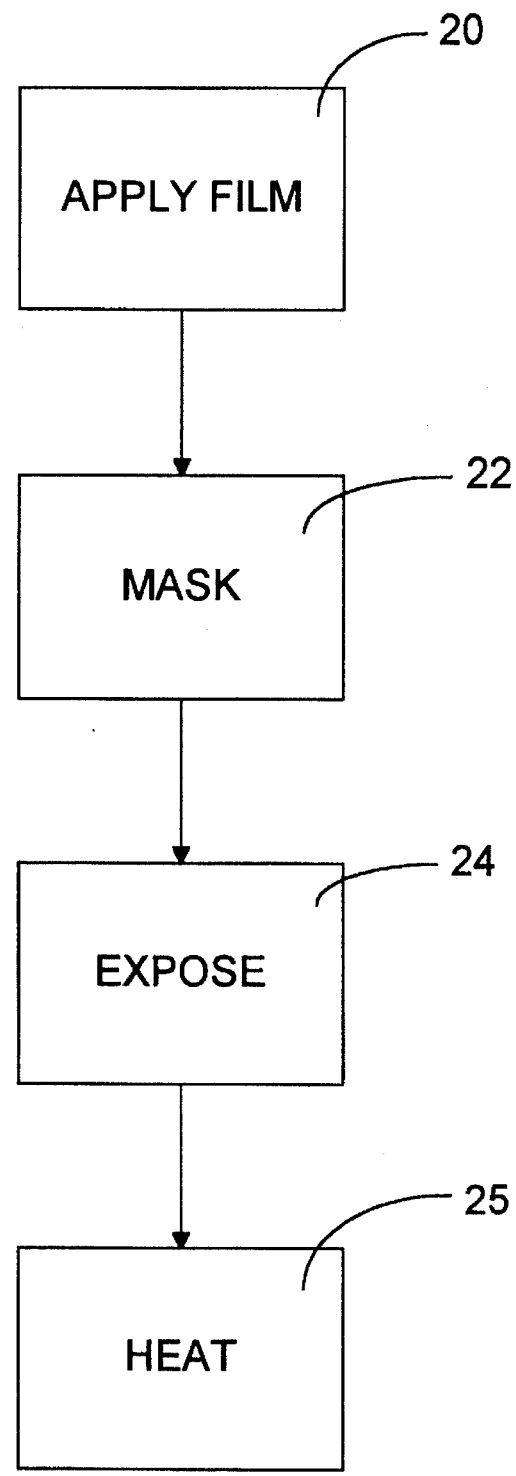
FIG. 3 is a block diagram of a first alternative method according to the invention.

In an alternative method according to the invention, as shown in FIG. 3, film 40 is heated in a selected atmosphere (step 25) after step 24 to a temperature at which first new material 70 is stable but metal complex 41 is unstable. The areas of film 40 which comprise metal complex 41 react at the increased temperature to form a different material. The chemical composition of the areas of film 40 which comprise material 70 are either substantially unaffected by the heating or affected differently by the heating. The result is a film 40 in which areas 60 and areas 61 have different properties.

In general, metal complex 41 is a complex of the formula $M_nL_m$, wherein n=1, 2, ... and m=1,2, ... and wherein M represents a metal atom and L represents a ligand. Complex 41 may be completely inorganic, organometallic or metal organic. M may be an alkali or alkaline earth material (for example Ba), a transition metal (for example Cr), a main group metal (for example Al), or an actinide (for example U). In general, metal complex 41 should be as small as possible while having the properties necessary to practise the invention.

Ligands L may all be identical or may be different. Ligands L are chosen so that complex 41 can be formed and has the properties that: 1) it can be deposited in an amorphous film on a substrate; 2) the amorphous film is stable or, at least, metastable; 3) on absorbing light of a required wavelength in a selected atmosphere the film can be transformed into a different metal containing material through a photo induced chemical reaction; and, 4) any byproducts of the photo induced chemical reaction should normally be sufficiently volatile to be removed from the film. To achieve the first two of these results, metal complex 41 should have a low polarity and low intermolecular forces. As organic groups usually have low intermolecular forces, ligands having organic groups at their outer peripheries tend to be satisfactory with respect to the first two requirements.

The atmosphere in which the photochemical reaction steps of the process of this invention take place may be an inert gas atmosphere, air, a gas containing a reactive element or compound, or a vacuum.

As noted above, film 40 must be amorphous. If film 40 were crystalline then it would be difficult or impossible for the ligands, or portions of the ligands to diffuse out of the film after they are severed by a photochemical reaction (for example, the reaction in step 24). This would cause the process to be very inefficient. Furthermore, in a crystalline material, the resolution of the process would be limited by the non-homogeneity of a crystalline film.

To make metal complex 41 resistant to reverting to a crystalline state, ligands L preferably are such that metal complex 41 is asymmetric. The size and shapes of organic portions of the ligands may be selected to optimize film stability and to adjust the thickness of film that will be deposited by the selected film deposition process. Metal complex 41 may be made asymmetric by using a ligand which itself has two or more stereoisomeric forms. For example, L may be racemic 2-ethylhexanoate. The resulting metal complex 41 has several different stereoisomeric forms.

The stability of an amorphous film with respect to crystallization may also be enhanced by making the film of a metal complex 41 which has several different ligands attached to each metal atom. Such metal complexes have several isomeric forms. For example, the reaction of $CH_3HNCH_2CH_2NHCH_3$ with a mixture of a nickel(II) salt and KNCS leads to the production of a mixture of isomers including the following:

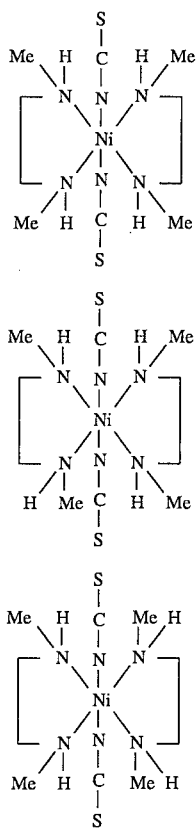

The chemical properties of the different isomers generally do not differ significantly, but the presence of several isomers in film 40 impairs crystallization of metal complex 41 in film 40.

Metal complex 41 must also be stable in the sense that it will not rapidly and spontaneously decompose under process conditions. The stability of complexes of a given metal, M, generally depends upon the oxidation state of the metal in the complex. For example, Ni(0) complexes are generally unstable in air. Consequently, a process for depositing Ni based films, which includes processing steps in an air atmosphere, should include a Ni(II) complex in preference to a Ni(0) complex.

To achieve the last requirement, at least one ligand must be reactive and be attached to complex 41 by a bond which is cleaved when the complex is raised to an excited state by the absorption of a photon. Preferably the reactive group is severed from the complex in a photochemical reaction initiated by ultraviolet light. To make the photochemical steps in the process efficient, it is highly preferable that the intermediate product produced when the reactive group is severed is unstable and spontaneously converts to the desired new material 70 and volatile byproducts.

There are several mechanisms by which a suitable photochemical reaction may occur. Some examples of suitable reaction mechanisms which may be exploited according to the invention are as follows:

(a) absorption of a photon may place metal complex 41 in a ligand to metal charge transfer excited state in which a metal to ligand bond in metal complex 41 is unstable. The bond breaks and the remaining parts of metal complex 41 spontaneously decompose;

(b) absorption of a photon may place metal complex 41 in a metal to ligand charge transfer excited state in which a metal to ligand bond in metal complex 41 is unstable. The bond breaks and the remaining parts of metal complex 41 spontaneously decompose;

(c) absorption of a photon may place metal complex 41 in a d—d excited state in which a metal to ligand bond in metal complex 41 is unstable. The bond breaks and the remaining parts of metal complex 41 spontaneously decompose;

(d) absorption of a photon may place metal complex 41 in an intramolecular charge transfer excited state in which a metal to ligand bond in metal complex 41 is unstable. The bond breaks and the remaining parts of metal complex 41 spontaneously decompose;

(e) absorption of a photon may place at least one ligand of metal complex 41 in a localized ligand excited state. In the excited state a bond between the excited ligand and the metal complex is unstable. The bond breaks and the remaining parts of metal complex 41 spontaneously decompose;

(f) absorption of a photon may place metal complex 41 in an intramolecular charge transfer excited state such that at least one ligand of metal complex 41 is unstable and decomposes. After the ligand decomposes the remaining parts of metal complex 41 are unstable and spontaneously decompose;

(g) absorption of a photon may place at least one ligand of metal complex 41 in a localized ligand excited state wherein the excited ligand is unstable and decomposes. After the ligand decomposes the remaining parts of metal complex 41 are unstable and spontaneously decompose; and (h) absorption of a photon may place metal complex 41 in a metal to ligand charge transfer excited state in which at least one ligand of metal complex 41 is unstable and decomposes. After the ligand decomposes the remaining parts of metal complex 41 are unstable and spontaneously decompose.

In its broad aspects the invention is not, however, limited to these reaction mechanisms.

The ligands are selected from ligands which meet the above criteria in the group comprising:
acetylacetonates (both substituted and unsubstituted);
dialkyldithiocarbamates;
carboxylates;
pyridines;
amines;
diamines;
arsines;
diarsines;
phosphines;
diphosphines;
arenes;
alkoxy ligands;
alkyl ligands; and
aryl ligands.

To enhance the desired photochemical characteristics, including the tendency of the products of the photochemical reaction to spontaneously thermally decompose, ligands from one or more of the following groups may be used alone or in combination with the ligands listed above:
oxalato;
halogens;
hydrogen;
hydroxy;
cyano;
carbonyl nitro;
nitrito;
nitrate;
nitrosyl;
ethylene;
acetylenes;
thiocyanato;
isothiocyanato;
aquo;
azides;
carbonato;
amine; and,
thiocarbonyl.

For example, if it is desired to make a patterned Ni film then one may start with a metal complex 41 having the formula $Ni(CH_3(H)NC_2H_4N(H)CH_3)_2(X)_2$ where $X=NO_2$. While the inventor does not wish to be adversely bound by any particular theory, it is believed that the photochemical reaction proceeds as follows:

$$Ni(CH_3(H)NC_2H_4N(H)CH_3)_2(X)_2 \rightarrow Ni(CH_3(H)NC_2H_4N(H)CH_3)_2(X)+NO_2 \quad (1)$$

$$Ni(CH_3(H)NC_2H_4N(H)CH_3)_2(X) \rightarrow Ni+\text{gaseous by products} \quad (2)$$

When in step (1) the complex absorbs a photon of light of an energy appropriate to break the Ni—$NO_2$ bond then a thermally unstable reactive radical is formed. In step (2) the radical rapidly decomposes into Nickel metal or, in the presence of air, nickel oxide. The detached ligands diffuse away.

Azide groups are particularly useful as ligands for promoting the initiation of a photochemical reaction with many metals. Ethylene, acetylenes and aquo ($H_2O$) ligands are generally useful to cause the products of a photochemical reaction to be thermally unstable because these groups do not tightly bond to most metals.

We have found that the process can be used to directly deposit a metal film. To generate high quality metal films it is generally preferable to create a patterned metal oxide film by the above methods and to then transform the metal oxide into a metal by reaction with a suitable reagent, such as hydrogen gas. This approach cannot be used to deposit films of metals such as aluminum which have very stable oxides ($Al_2O_3$ is very stable). Aluminum films may be directly deposited as described above.

Directly deposited metal films tend to have relatively poor quality because metal is opaque to light. Metal formed at the surface of film 40 tends to block light from reaching deeper portions of film 40. The metal film also tends to interfere with the diffusion of gaseous reaction products out of film 40. Directly deposited metal films may be useful as resistors and, where high conductivity is desired, can generally be made into better conductors by annealing. For example, where the conductor is copper, annealing may be carried out at 300° C. for ½ hour. In general, where an annealed film is desired, films made according to the invention may be annealed at temperatures at the low end of the range of generally accepted annealing temperatures for a given metallic material.

As noted above, ligands L should be such that metal complex 41 is small. In general, where the new material is a metal, a metal oxide, or a metal sulphide the ligands should not include any organic groups comprising more than about 26 carbon atoms. If the ligands do not include any phenyl groups, then the ligands preferably have 12, or fewer, carbon atoms each.

As it is desirable to apply metal complex 41 to substrate 44 by spin coating, it is preferable that metal complex 41 dissolve in and be stable with respect to a solvent suitable for use in spin coating. Many such solvents are known. Some examples are methylene chloride, acetone and toluene.

EXAMPLE 1

An amorphous film of $Cu_2(O_2CR)_4 \cdot 2H_2O$ with $R=(CH_2)_4CH_3$ having a thickness of 2 μm was deposited on a Silicon wafer by spin coating. In an air atmosphere at a temperature of 20° C., portions of the film were exposed to light having a wavelength of 254 nm. exposed portions of the film were converted to $Cu_2O$. It was possible to convert the $Cu_2O$ films to copper metal films by exposing them to a hydrogen atmosphere at a temperature of

TABLE 1

| $M_nL_m$ | Oxide Material | Atmosphere |
|---|---|---|
| $Cu_2(O_2CR)_4 \cdot 2H_2O$<br>$R = (CH_2)_4CH_3$ | $Cu_2O$ | air |
| $Cu_2(O_2CR)_4 \cdot 2H_2O$<br>$R = C(C_2H_5)H(CH_2)_3CH_3$ | $Cu_2O$ | air |
| $Cr(CO)_4(CH_3CH_2)_2N(C_2H_4)NH_2$ | $Cr_2O_3$ | air |
| $Ce(O_2CR)_3$<br>$R = C(C_2H_5)H(CH_2)_3CH_3$ | $Ce_xO_y$ | air/oxygen |
| $Y(O_2CR)_3$<br>$R = (CH_2)_4CH_3$ | $Y_xO_y$ | air/oxygen |
| $Y(O_2CR)_3$<br>$R = C(C_2H_5)H(CH_2)_3CH_3$ | $Y_xO_y$ | air/oxygen |
| $Ba(O_2CR)_2$<br>$R = C(C_2H_5)H(CH_2)_3CH_3$ | $Ba_xO_y$ | air/oxygen |
| $UO_2(O_2CR)_2$<br>$R = C_2H_4OC_2H_5$ | $U_xO_y$ | air/oxygen |
| $UO_2(O_2CR)_2$<br>$R = CH_2OC_2H_5$ | $U_xO_y$ | air/oxygen |
| $Al(C_5H_7O_2)_3$ | | |

300° C. for 30 minutes. The copper metal films produced had bulk resistivity.

Amorphous films of the metal complexes listed in Table 1 have been used to create the oxides listed in Table 1 according to the invention. As indicated by the variable subscripts x and y, the stoichiometry of some of these oxide materials was controlled by varying the amount of oxygen in the atmosphere surrounding the film as the photochemical reaction takes place.

With a suitable mask, patterns of lines of metal oxide films having a width of 0.5 μm have been deposited on a silicon substrate, as described above.

The chemical mechanisms of the photochemical reactions vary depending upon the starting metal complex. Where the starting metal complex is $Cr(CO)_4(CH_3CH_2)_2N(C_2H_4)NH_2$ it is thought that the electromagnetic radiation places the metal complex in a d—d excited state such that one or more of the metal to ligand bonds in the complex is unstable.

EXAMPLE 2

An amorphous film of $Cu_2(O_2CR)_4 \cdot 2H_2O$ with $R=(CH_2)_4CH_3$, as described in Example 1, was placed in a hydrogen atmosphere. Portions of the film were then exposed to light having a wavelength of 254 nm. The exposed portions of the film were converted to copper metal. After annealing the resulting Copper metal films in a hydrogen gas atmosphere at 200° C. for 4 hours the films had a conductivity of 1.8±0.25 μΩcm. Without limiting the generality of the foregoing, it is believed that the absorption of light places the metal complex in a ligand to metal charge transfer excited state in which the metal to ligand bond is unstable.

EXAMPLE 3

A 0.1 μm thick film of the metal complex $Ni(PEt_3)_2(NO_2)_2$ was deposited on a silicon substrate by spin coating. Portions of the film were exposed to light having a wavelength of 336 nm in vacuum for 24 hours. The substrate temperature was maintained at room temperature (approximately 24° C.). The exposed portions of the film were converted to Ni metal.

EXAMPLE 4

The method of the invention may be used to make films of materials containing several different metals. For example, $YBa_2Cu_3O_x$, films may be made by beginning with a stoichiometric mixture of the precursor metal complexes: $Cu_2(O_2CR)_4 \cdot 2H_2O$; $Ba(O_2CR)_2$; and $Y(O_2CR)_3$, where $R=C(C_2H_5)H(CH_2)_3CH_3$. The process is carried out, as described above, in Example 1.

Metal alloys may be produced by carrying out this process in an Oxygen-free atmosphere.

EXAMPLE 5

The method of the invention may be used to make amorphous films. For example, an amorphous film of a mixture of $Cr(CO)_4(H_2NCH_2CH_2N(CH_2CH_3)_2)$ and $Ni(PEt_3)_2(NO_2)_2$ ($Et \equiv CH_2CH_3$) was applied to a substrate. Upon photolysis with 254 nm light in an air atmosphere the exposed portions of the film were converted to an amorphous material of the stoichiometry $Cr_2O_3 \cdot NiO$.

EXAMPLE 6

The method of the invention is not limited to making metal and metal oxide films. With suitably chosen ligands, patterns of molecular materials may also be deposited. Some such materials have application in non-linear optics or as dielectric films. Using the methods of the invention to produce molecular materials produces pure chemicals as end products, unlike the impure end products which are produced by the photochemical reactions of polymers. For example, a film of the metal complex $Ni(CH_3(H)NC_2H_4N(H)CH_3)_2(NCS)_2$ was deposited by spin coating a solution of the complex in methylene chloride on a silicon substrate rotating at 1000 R.P.M. Portions of the film were exposed to ultraviolet light from a 100 W Hg vapour lamp in an Oriel Housing with condenser optics and filtered through a 10 cm water filter with quartz optics. The exposed portions of the film underwent a photochemical reaction to form the molecular complex: $[Ni(CH_3(H)NC_2H_4N(H)CH_3)_2(NCS)][NCS]$. The reaction is thought to proceed by cleavage of an NCS ligand as follows:

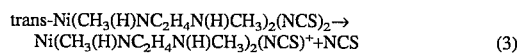
$$\text{trans-}Ni(CH_3(H)NC_2H_4N(H)CH_3)_2(NCS)_2 \rightarrow$$
$$Ni(CH_3(H)NC_2H_4N(H)CH_3)_2(NCS)^+ + NCS \quad (3)$$

The molecular complex formed may depend upon the frequency of light used to irradiate the initial metal complex film where there is more than one possible point of cleavage of the ligands in the initial metal complex.

As will be apparent to those skilled in the art in the light of the foregoing disclosure, many alterations and modifications are possible in the practice of this invention without departing from the spirit or scope thereof. For example, the processes described above use opaque masks to block light from portions of a film being patterned. Any method for selectively irradiating portions of a film being patterned while leaving other areas non-irradiated also come within the scope of the invention. Some examples of such methods include direct laser writing, contact masking and projection printing.

The processes described above have used spin coating to deposit films of metal complexes for practising the invention. The ability to create suitable films by using commonly available spin coating equipment is important and adds to the commercial value of the invention. However, other methods of depositing films of metal complexes come within the broad scope of the invention. Such methods include dip-coating, spraying, and other methods of depositing amorphous films of metal complexes on a substrate.

This disclosure has described processes in which light is used to trigger photochemical reactions in a metal complex which yield a metal or a metal containing material. The frequency of the radiation required depends primarily upon the metal complex in question. Visible, infrared, and ultraviolet light may be used with suitable metal complexes to practise the invention. Other triggers, such as electron beams, ion beams or atom beams, may also be used to practise the invention if they are able to populate the desired excited state (i.e. if they raise metal complex 41 to an energy state from which metal complex 41 can decompose by the path of the desired photochemical reaction.

The methods of the invention may be combined in various ways with prior art techniques. For example, a film of metal complex 41 may be deposited on a substrate according to the invention and then a first portion of the film may be converted to a first new material, such as a metal, by exposure to a focused ion or electron beam according to prior art methods. Subsequently, portions of the film adjacent the first new material may be converted to a second new material, such as a metal oxide, by the methods of the invention, as described above. The resulting structure is planar and utilizes the high resolution of the electron beam to accurately define the area of first new material. Accordingly, the scope of the invention is to be construed in accordance with the substance defined by the following claims.

What is claimed is:

1. A method for making a pattern of a metal containing material on a substrate, said method comprising the steps of:
   (a) depositing an amorphous film of a metal complex on a surface of a substrate;
   (b) placing said film in a first atmosphere; and
   (c) exposing a first area of said film to electromagnetic radiation to cause said metal complex in said first area to undergo a photo-chemical reaction, said reaction transforming said metal complex in said first area into a first metal containing material adherent to said substrate.

2. The method of claim 1 further comprising the steps of:
   (d) placing said film in a second atmosphere; and
   (e) exposing a second area of said film to electromagnetic radiation to cause said metal complex in said second area to undergo a photo-chemical reaction, said reaction transforming said metal complex in said second area into a second metal containing material adherent to said substrate;
   after said step of exposing first area of said film to electromagnetic radiation.

3. The method of claim 2 wherein said first area is adjacent said second area and said first and second metal containing materials form a planar structure on said substrate.

4. The method of claim 2 wherein said steps of exposing said first and second areas of said film to electromagnetic radiation respectively comprise aligning first and second masks over said substrate and illuminating surfaces of said masks away from said substrate with said electromagnetic radiation.

5. The method of claim 4 wherein said electromagnetic radiation comprises ultraviolet light.

6. The method of claim 2 wherein said first atmosphere comprises oxygen and said first metal containing material is a metal oxide.

7. The method of claim 1 wherein said first atmosphere comprises oxygen and said first metal containing material is a metal oxide.

8. The method of claim 7 wherein said first atmosphere is air.

9. The method of claim 7 further comprising the step of removing remaining metal complex from said substrate after said step of exposing said first area of said film to electromagnetic radiation.

10. The method of claim 7 further comprising the step of reacting said metal oxide with a suitable chemical in a suitable atmosphere to reduce said metal oxide to a metal adherent to said substrate.

11. The method of claim 1 wherein a local temperature of said first metal containing material is maintained below an annealing temperature of said first metal containing material throughout said step of exposing first area of said film to electromagnetic radiation.

12. The method of claim 11 wherein said local temperature is maintained below 320° C.

13. The method of claim 1 wherein said step of exposing said first area of said film to electromagnetic radiation comprises aligning a first mask over said substrate and illuminating a surface of said mask away from said substrate with said electromagnetic radiation.

14. The method of claim 13 wherein said electromagnetic radiation comprises ultraviolet light.

15. The method of claim 1 wherein said metal complex comprises one or more metal atoms bonded to one or more ligands, at least one of said one or more ligands is bonded to said metal complex by a chemical bond which is broken by the absorption of electromagnetic radiation, wherein said complex is thermally unstable when said at least one ligand is removed.

16. The method of claim 15 wherein said at least one ligand comprises an azide group.

17. The method of claim 15 wherein said ligands are selected from the group consisting of: substituted acetylacetonates; unsubstituted acetylacetonates; dialkyldithiocarbamates; carboxylate; pyridines; amines; diamines; arsines; diarsenes; phosphines; diphosphenes; arenes; alkoxy ligands; alkyl ligands; and aryl ligands.

18. The method of claim 17 wherein said ligands do not comprise any organic groups containing more than 26 carbon atoms.

19. The method of claim 18 wherein said ligands do not comprise any organic groups containing more than 12 carbon atoms.

20. The method of claim 18 wherein said at least one ligand comprises ($O_2CR$) wherein R is a short chain organic group.

21. The method of claim 20 wherein R is $(CH_2)_4CH_3$.

22. The method of claim 17 wherein said metal complex comprises more than one ligand and at least one of said ligands is selected from the group consisting of: oxalato; halogens; hydrogen; hydroxy; cyano; carbonyl; nitro; nitrito; nitrate; nitrosyl; ethylenes; acetylenes; thiocyanato; isothyocyanato; aquo; azides; carbonato; amine; and, thiocarbonyls.

23. The method of claim 15 wherein said absorption of said electromagnetic radiation places said metal complex in a ligand to metal charge transfer excited state in which a metal to ligand bond in said metal complex is unstable.

24. The method of claim 15 wherein said absorption of said electromagnetic radiation where the electromagnetic radiation places said metal complex in a metal to ligand charge transfer excited state in which a metal to ligand bond in said metal complex is unstable.

25. The method of claim 15 wherein said absorption of said electromagnetic radiation places said metal complex in a d—d excited state such that a metal to ligand bond in said complex is unstable.

26. The method of claim 15 wherein said absorption of said electromagnetic radiation places said metal complex in an intramolecular charge transfer excited state such that a metal to ligand bond in said complex is unstable.

27. The method of claim 15 wherein said absorption of said electromagnetic radiation places at least one of said ligands in a localized ligand excited state wherein a bond between said excited ligand and said metal complex is unstable.

28. The method of claim 1 wherein said absorption of said electromagnetic radiation places said metal complex in a intramolecular charge transfer excited state such that at least one of said at least one ligands is unstable and degrades.

29. The method of claim 1 wherein said absorption of said electromagnetic radiation places at least one of said ligands in a localized ligand excited state wherein said excited ligand is unstable and degrades.

30. The method of claim 1 wherein said absorption of said electromagnetic radiation places said metal complex in a metal to ligand charge transfer excited state such that at least one of said at least one ligands is unstable and degrades.

31. The method of claim 1 wherein said absorption of said electromagnetic radiation places said metal complex in a ligand to metal charge transfer excited state such that at least one of said at least one ligands is unstable and degrades.

32. A method for making a planar pattern of a metal containing material on a substrate, said method comprising the steps of:

(a) depositing an amorphous film of a metal complex on a surface of a substrate;

(b) placing said film in a first atmosphere;

(c) exposing a first area of said film to an electron beam or an ion beam to cause said metal complex in said first area to be transformed into a first new material adherent to said substrate;

(d) placing said film in a second atmosphere; and (e) exposing a second area of said film adjacent said first area to electromagnetic radiation of a wavelength suitable to cause said metal complex in said second area to undergo a photo-chemical reaction, said reaction transforming said metal complex in said second area into a second metal containing material adherent to said substrate.

* * * * *